United States Patent
Collins et al.

(10) Patent No.: US 7,173,468 B2
(45) Date of Patent: Feb. 6, 2007

(54) MULTIPLE-INPUT, SINGLE-EXIT DELAY LINE ARCHITECTURE

(75) Inventors: Hansel A. Collins, Mountain View, CA (US); John E. Linstadt, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 10/950,608

(22) Filed: Sep. 27, 2004

(65) Prior Publication Data

US 2006/0066372 A1    Mar. 30, 2006

(51) Int. Cl.
*H03H 11/26* (2006.01)

(52) U.S. Cl. .................... 327/284; 327/277
(58) Field of Classification Search .............. None
See application file for complete search history.

(56) References Cited

U.S. PATENT DOCUMENTS

| | | | |
|---|---|---|---|
| 6,172,537 B1 * | 1/2001 | Kanou et al. | 327/99 |
| 6,229,363 B1 * | 5/2001 | Eto et al. | 327/158 |
| 6,388,484 B1 * | 5/2002 | Kamoshida et al. | 327/161 |
| 6,570,813 B2 * | 5/2003 | Van De Graaff | 365/233 |
| 6,759,883 B2 * | 7/2004 | Gomm | 327/276 |
| 6,879,200 B2 * | 4/2005 | Komura et al. | 327/278 |
| 6,930,525 B2 * | 8/2005 | Lin et al. | 327/161 |
| 2003/0052719 A1 * | 3/2003 | Na | 327/158 |
| 2004/0217788 A1 * | 11/2004 | Kim | 327/158 |
| 2005/0024107 A1 * | 2/2005 | Takai et al. | 327/158 |

* cited by examiner

*Primary Examiner*—Timothy P. Callahan
*Assistant Examiner*—Cassandra Cox
(74) *Attorney, Agent, or Firm*—Bever, Hoffman & Harms, LLP; Patrick T. Bever (57) ABSTRACT

A delay line includes a delay chain consisting of series-connected NAND gate delay stages with a delayed output signal extracted from the final delay stage. Tap decode gates are preferably used to "inject" the input signal to be delayed into the delay chain using one input of the NAND gate delay stage, referred to as an "injection point." The desired delay is achieved by selecting an injection point relative to the final delay stage, or exit point, of the delay chain. Selection of an injection point is provided by the binary decode of a tap address that activates the injection NAND gate delay stage, allowing the injected signal to propagate from the activated injection point to the exit point of the delay chain.

24 Claims, 9 Drawing Sheets

MULTIPLE-INPUT, SINGLE-EXIT DELAY LINE ARCHITECTURE

FIELD OF THE INVENTION

The present invention relates to integrated circuits and, more particularly, to integrated circuits that delay an electrical signal during propagation from an input to an output. Specifically, one embodiment of the present invention provides a delay line architecture that has a reduced area requirement and reduced power consumption characteristics, while preferably providing increased signal delay performance via increased variable delay resolution.

BACKGROUND OF THE INVENTION

Variable digital delay lines based on a multi-tap architecture implemented in silicon have a large dynamic range of operation and are generally selected for such applications as clock skew compensation, data recovery, delay and time measurements, as well as signal synthesis. As the performance specifications for these applications continue to stress critical design parameters such as power dissipation requirements, delay-tap resolution, and overall physical size, the known conventional architecture has become increasingly limited.

The architecture of the conventional variable multi-tap digital silicon-based delay line comprises a delay chain connected to a 1-of-N multiplexer output circuit. Each of the inputs of the 1-of-N multiplexer output circuit is connected to a tap of the delay chain. A signal applied to the input of the delay chain propagates down the length of the delay chain and is sampled at a particular tap using the tap-select 1-of-N multiplexer output circuit. The final delay contribution is equal to the total number of delay stages the signal has passed through plus the propagation delay of the multiplexer output circuit.

Figure 1:
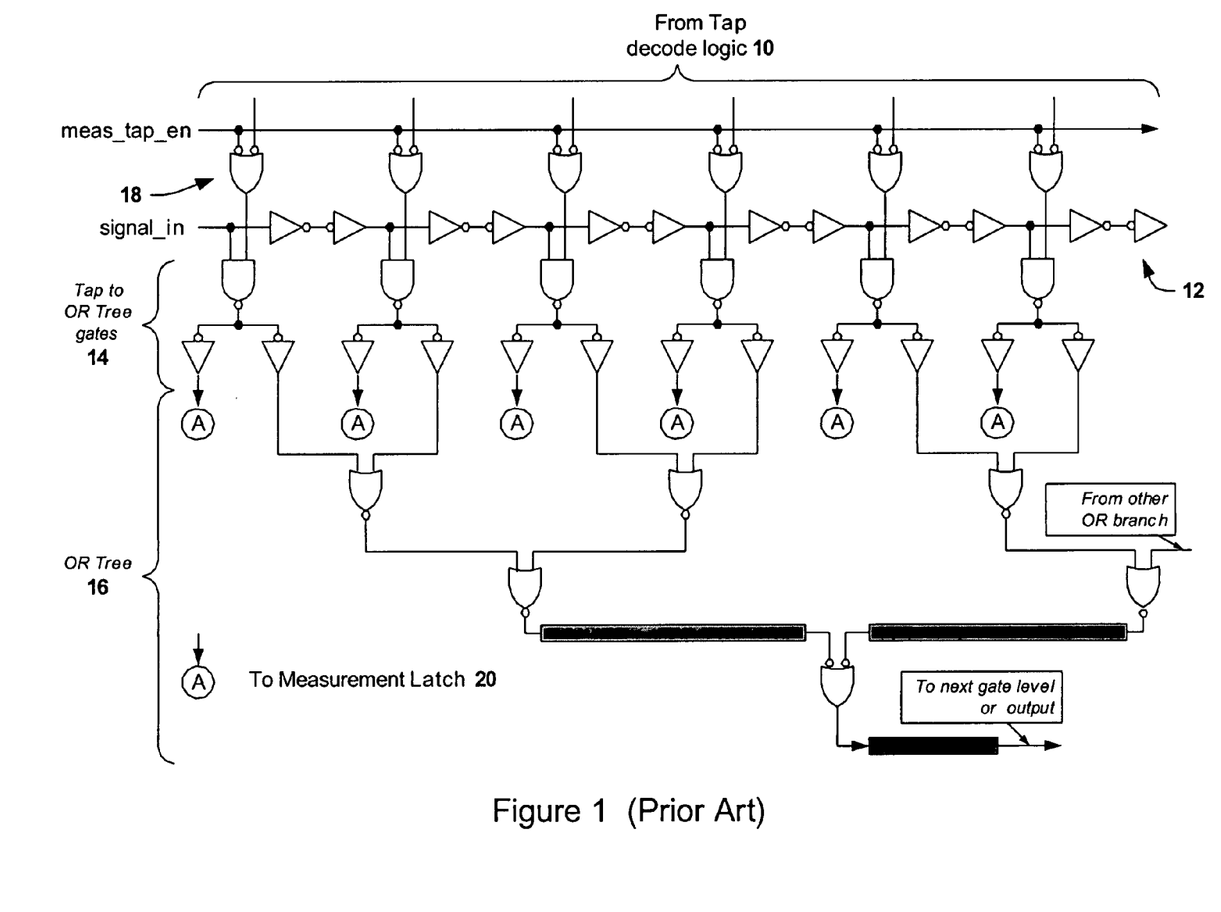
FIG. 1 is a schematic diagram of a conventional multi-tap variable digital delay line utilizing a 1-of-N multiplexer output circuit.

Considered in more detail, as shown in FIG. 1, the conventional multi-tap variable digital delay line utilizes tap decode logic 10 comprising a 1-of-N input selector connected to an inverter delay chain 12. As part of the configuration, a set of tap-to-OR-tree gates 14 is included to reduce tap loading and fan out to a measurement latch 20 and balanced OR tree 16. Also included is a set of measurement gates 18 to enable the tap-to-measurement-latch path during a delay measurement operation. The balanced OR tree 16 comprises a 1-of-N multiplexer output circuit to route the signal from the selected tap of the delay chain 12 to the final output.

The conventional multi-tap variable digital delay line has several critical disadvantages. First, the delay of the 1-of-N multiplexer output circuit is large and is a significant portion of the latency of the overall structure. Second, in general, the resolution of this structure is limited to a buffer, or twice the inverter delay. Increasing the resolution down to a single inverter delay requires the addition of another multiplexer structure or the addition of an inverter string offset by an inverter delay with a significant increase in power consumption. Third, with the 1-of-N multiplexer output circuit placed after the delay chain, the delay associated with the multiplexer output circuit cannot be directly included in delay calculation, nor does its placement allow its delay to be automatically included in de-skew or other latency-sensitive applications. Other disadvantages are the overall size of the 1-of-N multiplexer output circuit and power consumed. Thus, the limiting aspects of the conventional multi-tap variable digital delay line are primarily attributable to the 1-of-N multiplexer output circuit.

It would therefore be desirable to provide a delay line architecture having improved delay-tap resolution. Additionally, it would be desirable to provide a delay line architecture that eliminates the need for a tap-select multiplexer output circuit, thus avoiding the added latency, reducing the overall size of the structure, and decreasing the amount of power consumption. Such a delay line architecture would have significant advantages.

SUMMARY OF THE INVENTION

The present invention provides a method and apparatus for delaying an electrical signal propagating from an input to an output. One embodiment of the present invention provides a variable digital delay line architecture in which the input signal is introduced at 1-of-N nodes along the length of a delay chain and the delayed output signal is extracted from the final tap, or exit, of the delay chain, referred to as a multiple-input, single-exit delay line, or "MISX-DL." The desired delay is achieved by introducing the input signal at a desired node relative to the exit of the delay chain, thereby eliminating the need for a tap-select multiplexer output circuit.

One preferred embodiment of the present invention comprises a delay chain of delay stages preferably consisting of series-connected NAND gate delay stages with a delayed output signal extracted from the last delay stage. A set of tap decode gates is preferably used to "inject" the input signal to be delayed into the delay chain using one input of the NAND gate delay stage, referred to as an "injection point." The desired delay is achieved by selecting an injection point relative to the last delay stage, or exit point, of the delay chain. Selection of an injection point is provided by the binary decode of a tap address that activates the injection NAND gate delay stage, allowing the injected signal to propagate from the activated injection point to the exit point of the delay chain.

Various modifications are contemplated to extend the resolution and dynamic range of the variable multiple-input, single-exit digital delay line architecture in accordance with the various embodiments of the present invention. For example, the resolution of the delay chain can be increased based on a modification to include a phase splitter circuit and appropriately connected pass-gate injectors from either of the phase splitter circuit outputs to injection points. Another modification is the inclusion of selectable "trim circuits" at each NAND gate delay stage, providing increased delay resolution. The increased resolution is directly proportional to the incremental delay provided by the trim circuits.

The hardware implementation of the variable multiple-input, single-exit digital delay line architecture in accordance with the various embodiments of the present invention provides a delay line having a reduced parts count and reduced power consumption. The variable multiple-input, single-exit digital delay line architecture in accordance with the present invention eliminates the conventional 1-of-N multiplexer output circuit, thereby reducing power dissipation and area requirements, while preferably increasing the effective delay-tap resolution. As a direct result of eliminating a conventional multiplexer output circuit, a reduction of the structure's overall size, delay latency, and switching power is achieved. A consequence of the architecture in accordance with the various embodiments of the present invention is that a portion of the delay chain not currently in use automatically enters a non-switching quiescent mode, further reducing the delay line's active power.

Further, with the incorporation of a signal phase splitter circuit, this architecture can easily support resolutions based on a gate delay with a very small increase in the number of transistors required, to effectively double its resolution. Attempting to achieve comparable delay resolution using a conventional multi-tap variable digital delay line would minimally require the addition of an inverting and non-inverting tap-select multiplexer circuit, significantly increasing the size of the overall structure.

DETAILED DESCRIPTION OF THE PREFERRED EMBODIMENTS

In accordance with the various embodiments of the present invention and referring now to the figures, wherein like reference numerals identify like elements of the various embodiments of the invention, one can effectively delay an electrical signal during propagation from an input to an output by providing a variable multiple-input, single-exit digital delay line architecture that has a reduced parts count and area requirement and reduced power consumption characteristics, while providing increased signal delay performance via increased variable delay resolution. The delay line having a reduced parts count and area requirement and reduced power consumption has significant advantages for many applications.

Figure 2:
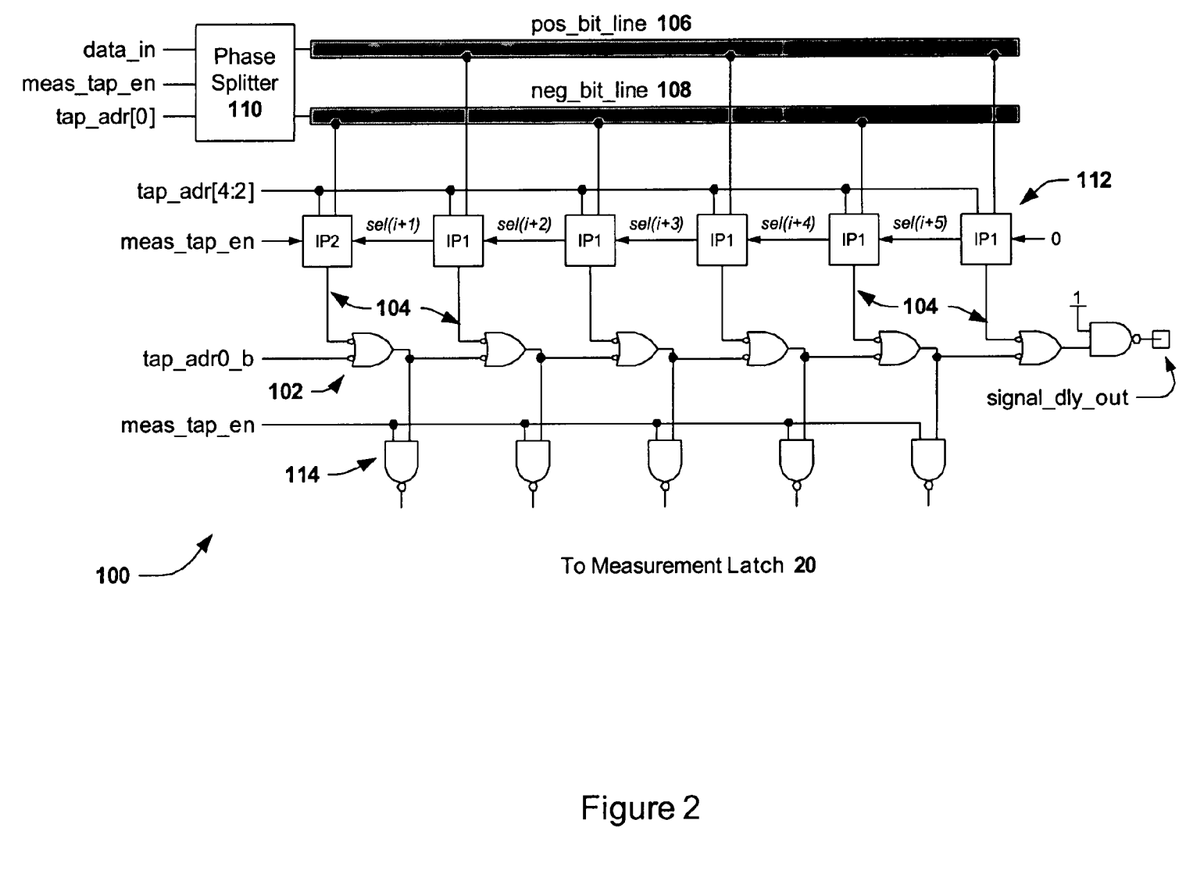
FIG. 2 is a schematic diagram of one embodiment of the variable multiple-input, single-exit digital delay line architecture in accordance with the present invention.

An embodiment of the multiple-input, single-exit delay line ("MISX-DL") architecture in accordance with the present invention with 1× resolution is illustrated in the schematic diagram shown in FIG. 2. Generally, the delay line architecture and operation are as follows.

As shown in FIG. 2, the 1× MISX-DL ("MISX-DL1n"), generally indicated by the numeral 100, comprises a cascaded string of NAND gate delay stages 102 forming a delay line with multiple NAND gate signal "injection points" 104 with one NAND gate input coupled to either a positive bit line (pos_bit_line) 106 or a negative bit line (neg_bit_line) 108. The bit lines 106, 108 are preferably driven by a balanced phase splitter circuit 110 to be described below in conjunction with FIG. 4, to create an inverted version and a non-inverted version of a data_in input signal to be delayed. The output of each NAND gate delay stage 102 preferably drives an associated measurement control gate 114.

As also shown in FIG. 2, tap decode gates 112 decode a binary value tap_adr[4:2] of a tap_adr vector for a selected node and enable the corresponding injection point 104. A tap_adr0_b signal of the tap_adr vector is routed to the NAND gate input on the Nth NAND gate delay stage 102 to prevent the propagation of a "lock-up" condition into the active delay stages. A "lock-up" condition occurs when the output of the NAND gate of the previous non-participating delay stage is at a value such that it prevents later delay stages from passing the data_in signal to be delayed.

Figure 3:
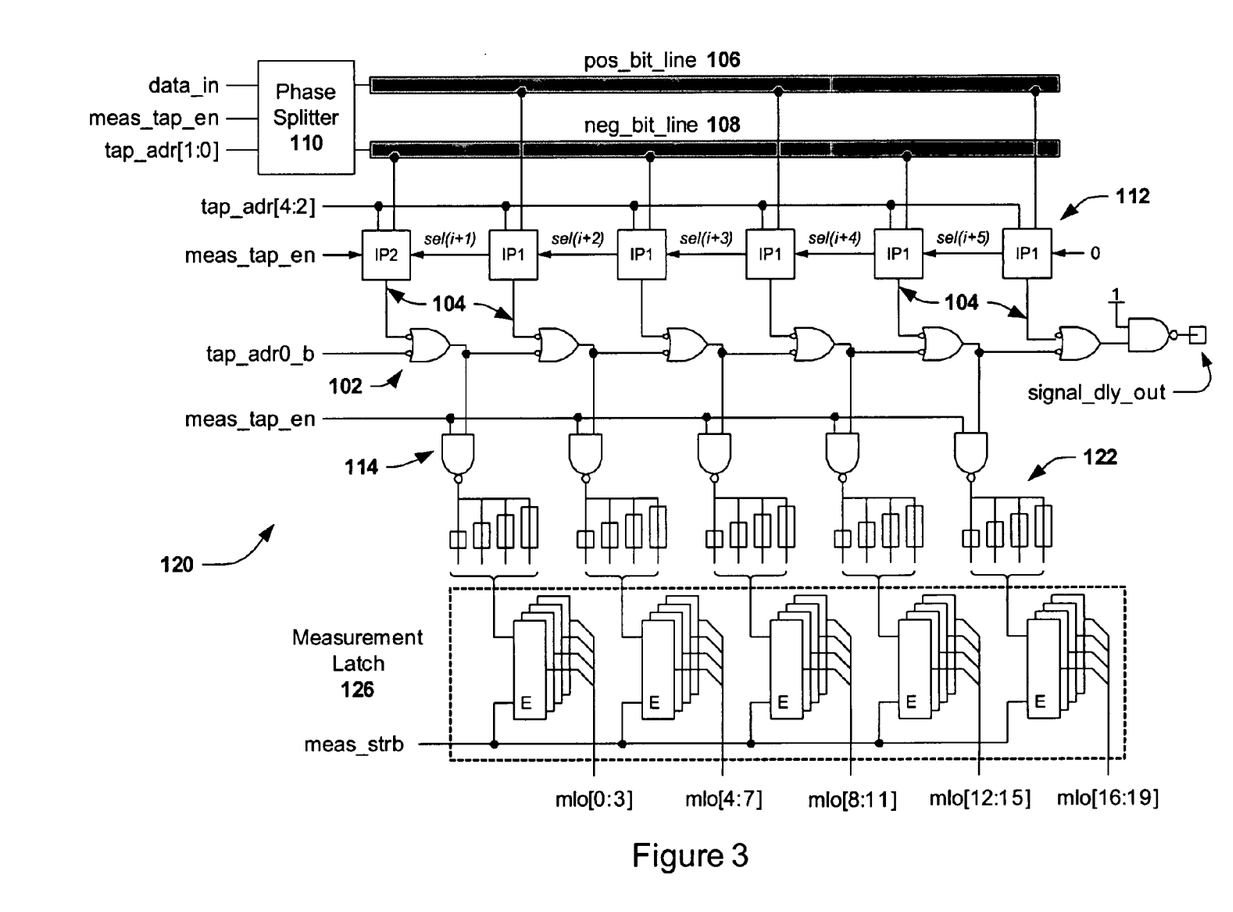
FIG. 3 is a schematic diagram of another embodiment of the variable multiple-input, single-exit digital delay line architecture in accordance with the present invention.

Another embodiment of the multiple-input, single-exit delay line ("MISX-DL") architecture in accordance with the present invention having 4× resolution is illustrated in the schematic diagram shown in FIG. 3. Generally, the delay line architecture and operation are as follows.

As shown in FIG. 3, the 4× MISX-DL ("MISX-DL4n"), generally indicated by the numeral 120, includes a modified balanced phase splitter circuit 110 having an internal cascaded trim delay circuit and a cascaded string of NAND gate delay stages 102 forming a delay chain with an effective 0.25 tap resolution, for example, resulting from "injection points" 104 receiving a copy of the data_in signal from either the positive bit line 106 or the negative bit line 108, the NAND gate delay stages being coupled to cascaded trim circuits 122 having a resolution of 0.25 tap delay. The bit lines 106, 108 are driven by the phase splitter circuit 110 having an internal cascaded trim delay circuit with an increased resolution of 0.25 tap delay to create an inverted copy and a non-inverted copy of the data_in input signal, as will be further described below in conjunction with FIG. 4.

The output of each NAND gate delay stage 102 preferably drives the associated measurement control gate 114. The measurement control gates 114 drive the cascaded trim circuits 122 having a matching resolution of 0.25 tap delay. The output of each of the cascaded trim circuits 122 is connected to the input of a measurement latch 126.

Figure 3A:
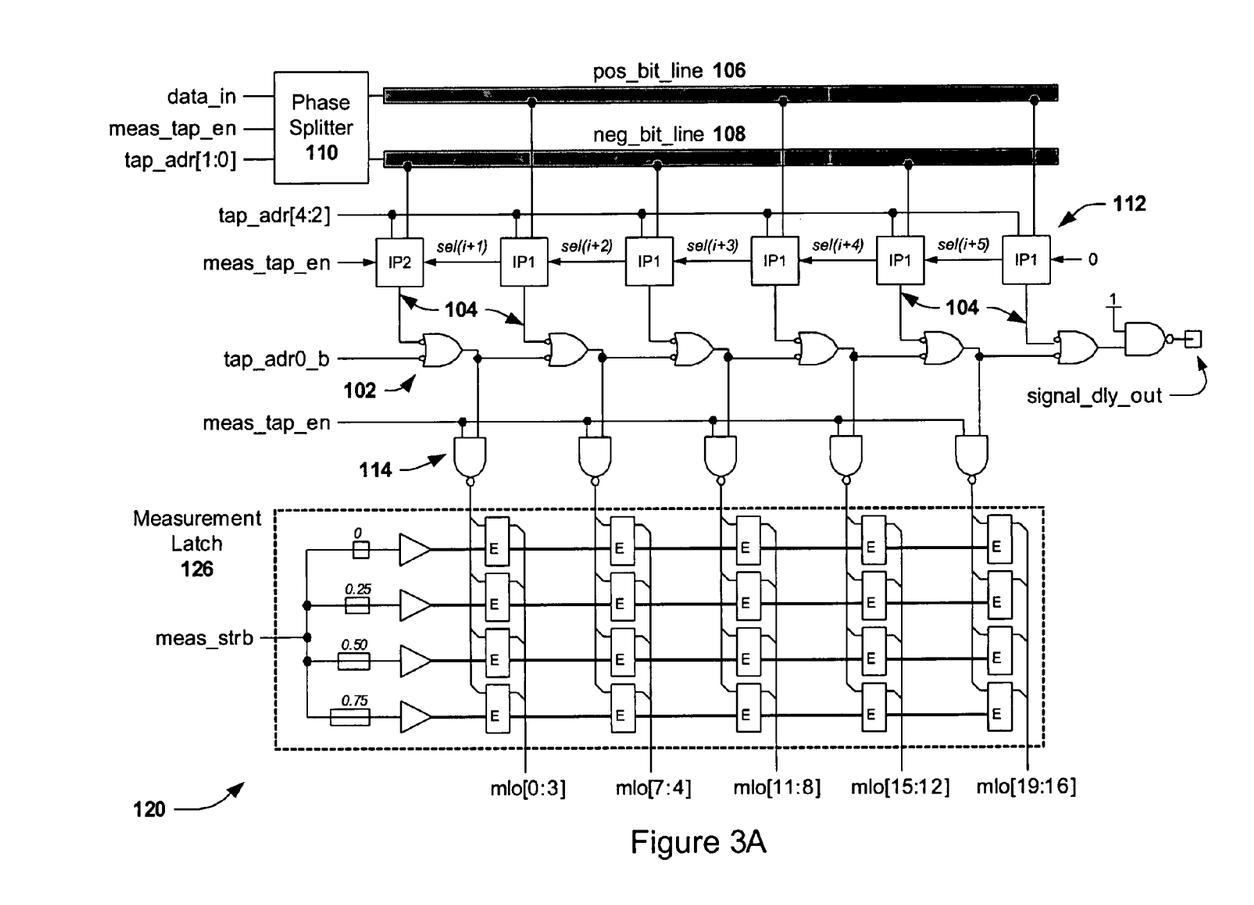
FIG. 3A is a schematic diagram of yet another embodiment of the variable multiple-input, single-exit digital delay line architecture in accordance with the present invention.

In another embodiment of the 4× MISX-DL ("MISX-DL4n") in accordance with the present invention, generally indicated by the numeral 120 shown in FIG. 3A, a trim delay circuit is provided in the measurement latch 126 to produce multiple phases of a meas_strb signal each having a 0.25 tap delay resolution, for example. As shown in FIG. 3A, the measurement control gates 114 drive four latch elements, each latch element receiving a strobe from a different phase of the meas_strb signal resulting in an effective resolution of 0.25 tap delay. The embodiment shown in FIG. 3A eliminates the cascaded trim delay circuits at each measurement control gate shown in FIG. 3, thus reducing the overall area required.

The tap decode gates 112 decode the binary value tap_adr [4:2] of a tap_adr vector for the selected node and enable the corresponding NAND gate injection point 104. The tap_adr [1:0] signal of the tap_adr vector is used to select the incremental 0.25 tap delay. Higher resolution can be achieved by reducing the sub-tap delay of the cascaded trim circuits 122 and the internal trim delay circuits of the phase splitter circuit 110 of FIG. 4. The tap_adr0_signal of the tap_adr vector is routed to the NAND gate input on the Nth NAND gate delay stage 102 to prevent the propagation of a "lock-up" condition into the active delay stages.

Figure 4:
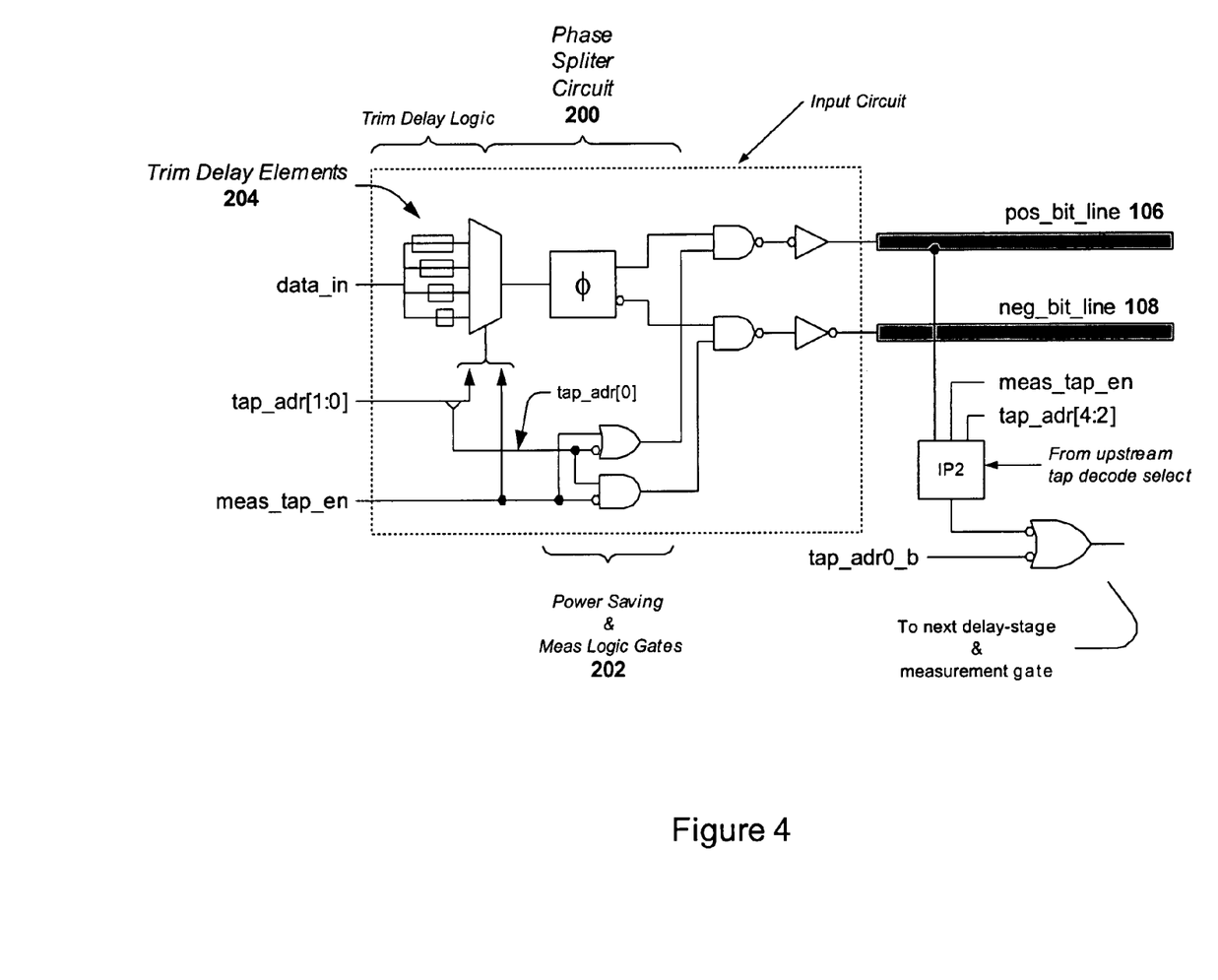
FIG. 4 shows a schematic diagram of a phase splitter circuit in accordance with a modification of the variable multiple-input, single-exit digital delay line architectures in accordance with the present invention shown in FIGS. 2 and 3.

As mentioned earlier, the multiple-input, single-exit delay line ("MISX-DL") architecture in accordance with a modification of the present invention preferably additionally comprises the phase splitter circuit 110 comprising a balanced phase splitter and input control logic circuit, generally indicated by the numeral 200 shown in FIG. 4. In the embodiment of the multiple-input, single-exit delay line shown in FIG. 3, the phase splitter circuit 110 further comprises a trim delay circuit 204 to delay the data_in signal with an incremental delay of 0.25 tap delay, for example. The incremental delay is selected by a tap address signal tap_adr[1:0]. The balanced phase splitter input control logic circuit 200 generates balanced inverted and non-inverted copies of the data_in input signal and routes these copies to the pos_bit_line 106 and neg_bit_line 108 based on the state of control signals meas_tap_en and tap_adr[1:0]. Also shown in FIG. 4 are power saving and measurement logic gates 202 that force the unused bit line into a quiescent state based on the value of the tap_adr[1:0] signal. As a result, only that portion of the delay chain needed to achieve the desired amount of signal delay remains active, thereby reducing the amount of switching power.

Figure 5:
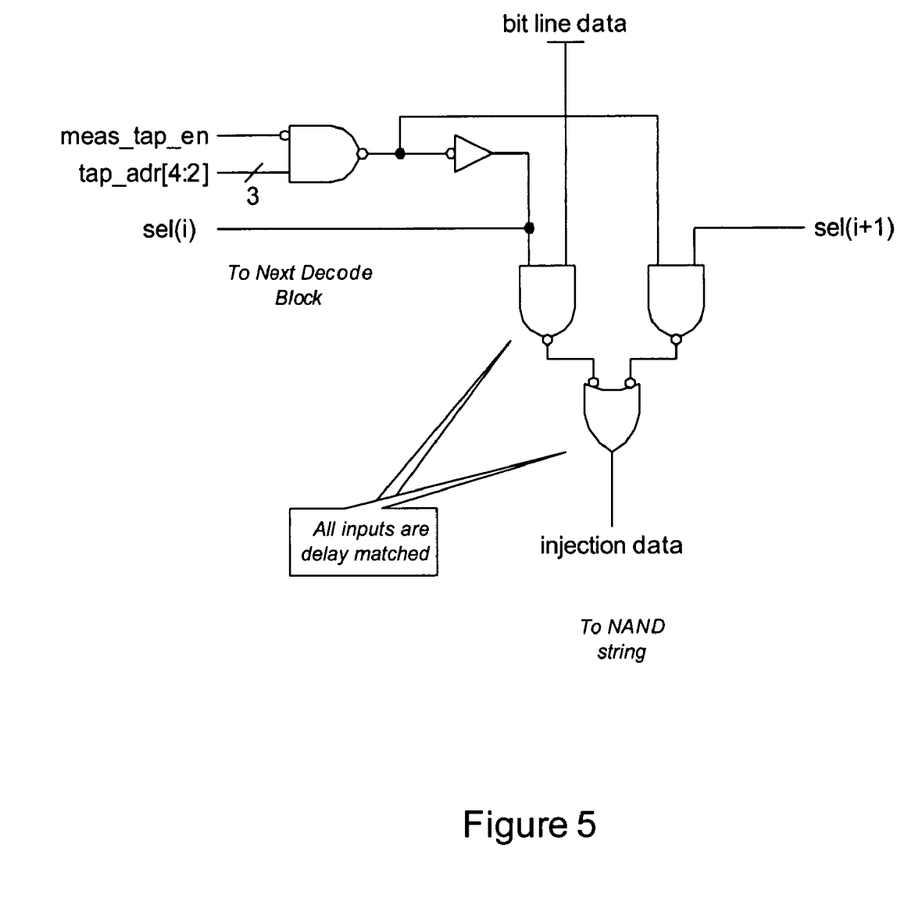
FIG. 5 is a schematic diagram of one tap decode logic circuit comprising the variable multiple-input, single-exit digital delay line architectures of the present invention shown in FIGS. 2 and 3.
Figure 6:
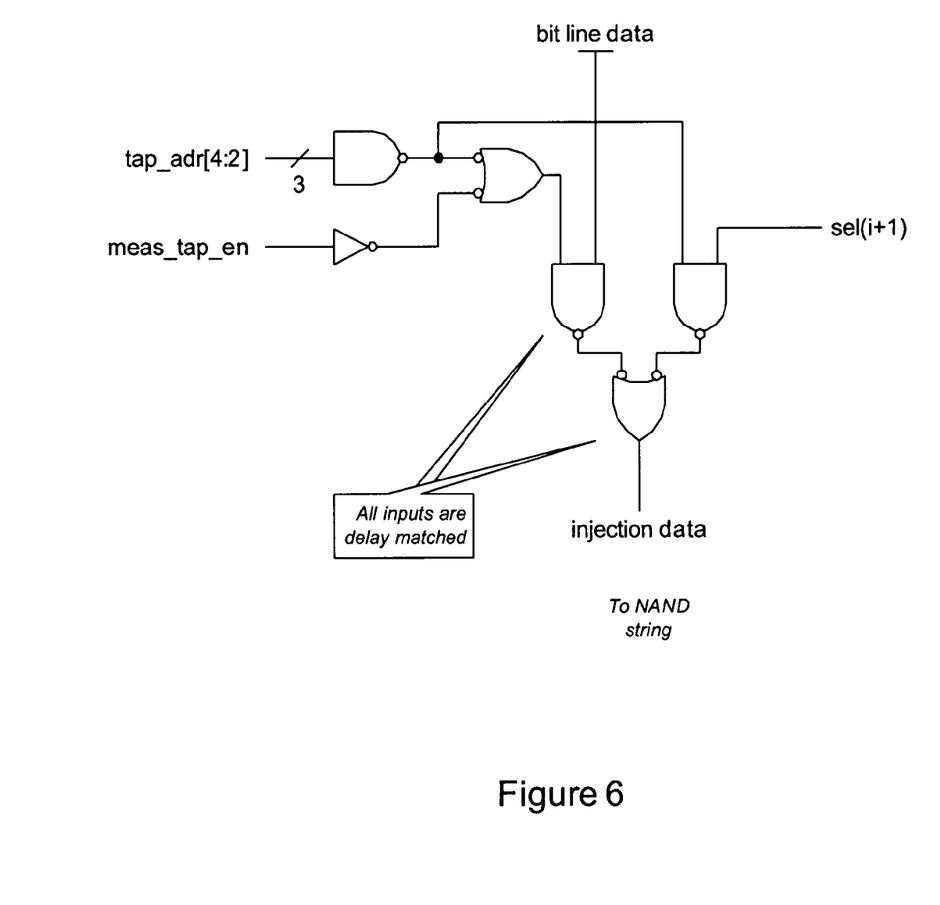
FIG. 6 is a schematic diagram of another tap decode logic circuit comprising the variable multiple-input, single-exit digital delay line architectures of the present invention shown in FIGS. 2 and 3.

FIG. 5 is a schematic diagram of one configuration of a tap decode logic circuit used to select the injection point 104. The tap decode logic circuit shown in FIG. 5 preferably implements the tap decode gates 112 labeled IP1 shown in FIGS. 2 and 3. FIG. 6 is a schematic diagram of another configuration of a tap decode logic circuit used to select the injection point 104 logically located farthest from the exit of the delay chain. The tap decode logic circuit shown in FIG. 6 preferably implements the tap decode gate 112 labeled IP2 shown in FIGS. 2 and 3.

During operation of the variable multiple-input, single-exit digital delay line architecture shown in FIGS. 2 and 3, the delayed signal signal_dly_out of the delay line is extracted from the final NAND gate delay stage 102. The desired amount of signal delay is achieved by selecting 1-of-N of the delay line's injection points 104 relative to the injection point of the final NAND gate delay stage 102.

Considered in more detail, during operation of the variable multiple-input, single-exit digital delay line architecture shown in FIGS. 2 and 3, control signal meas_tap_en is de-asserted. The meas_tap_en signal is held in a logical zero state as a step of a method to reduce switching noise and power.

Preferably, the current value of the tap_adr[1:0] vector routes the input signal data_in through the phase splitter and input control logic circuit 200 to develop inverted and non-inverted phase-balanced copies of the data_in signal, as shown in FIG. 4. The inverted copy of the data_in signal is driven onto the neg_bit_line 108, while the non-inverted copy is driven onto the pos_bit_line 106. A copy of the data_in signal from either the neg_bit_line 108 or the pos_bit_line 106 is injected into the NAND gate delay stage 102 comprising the delay chain via the injection point 104 of the selected NAND gate delay stage.

The amount of delay provided by the variable multiple-input, single-exit digital delay line architecture 100, 120 shown in FIGS. 2 and 3 is determined from the full tap_adr [4:0] vector value. In the embodiment of the multiple-input, single-exit delay line shown in FIGS. 3 and 3A, the tap_adr [1:0] signal selects the trim delay circuit to select a desired 0.25 tap delay resolution. The tap_adr[4:2] vector value is decoded by the tap decode gates 112 that select 1-of-N of the injection points 104 that translate into a specific amount of signal delay. For many applications, a portion of the number of available delay stages implemented is utilized to develop the amount of delay required. The remaining "non-participating" delay stages are logically "tied off" such that they do not propagate a lock-up condition into the active delay stages. To prevent "lock-up," the tap_adr0_b signal is fed into the delay stage logically farthest from the final delay stage. The polarity of the tap_adr0_b signal fed into this delay stage depends on the number of physical delay stages implemented. The tap_adr0_b signal assures that the previous delay stage to the selected injection point 104 is placed into its inert state.

During operation of the variable multiple-input, single-exit digital delay line architecture 100 or 120, either the pos_bit_line 106 or the neg_bit_line 108 is used. Hence, to further reduce power consumption, the unused bit line is preferably placed into a quiescent state. As shown in FIG. 4, the quiescent state of the bit line is determined by the tap_adr[1:0] signal, where, for example, the pos_bit_line 106 is quiescent for tap_adr[1:0] with a value of one, and the neg_bit_line 108 is quiescent for tap_adr[1: with a value of zero.

In accordance with the present invention, a method for delay measurement may be performed on the variable multiple-input, single-exit digital delay line architecture. When conducting a "regular" delay measurement, the meas_tap_en control signal is asserted, forcing the selection of the minimum trim delay and the signal to be injected at the Nth injection point 104. The Nth injection point 104 is logically located the farthest from the final NAND gate delay stage 102 such that the data_in signal travels through all delay stages, providing the longest delay available. Assertion of the meas_tap_en signal enables the measurement control gates 114, allowing the measurement latch 20, 126 to capture an instantaneous delay image of the signal from each tap of the delay chain stages.

Considered in more detail, during a "regular" delay measurement operation, the meas_tap_en signal is asserted, which enables the measurement control gates 114 and activates the injection point 104 logically located farthest from the final NAND gate delay stage 102. Each of the measurement control gates 114 passes its version of the data_in signal from a corresponding tap of the delay chain 100, 120 through to the corresponding input of the measurement latch 20, 126. The output of each measurement latch bit is either inverting or non-inverting to correct for the bi-modal representation of the delay image captured during measurement. Post bi-modal correction is preferred as a method for eliminating the need to delay-balance inverting and non-inverting critical timing paths.

Figure 7:
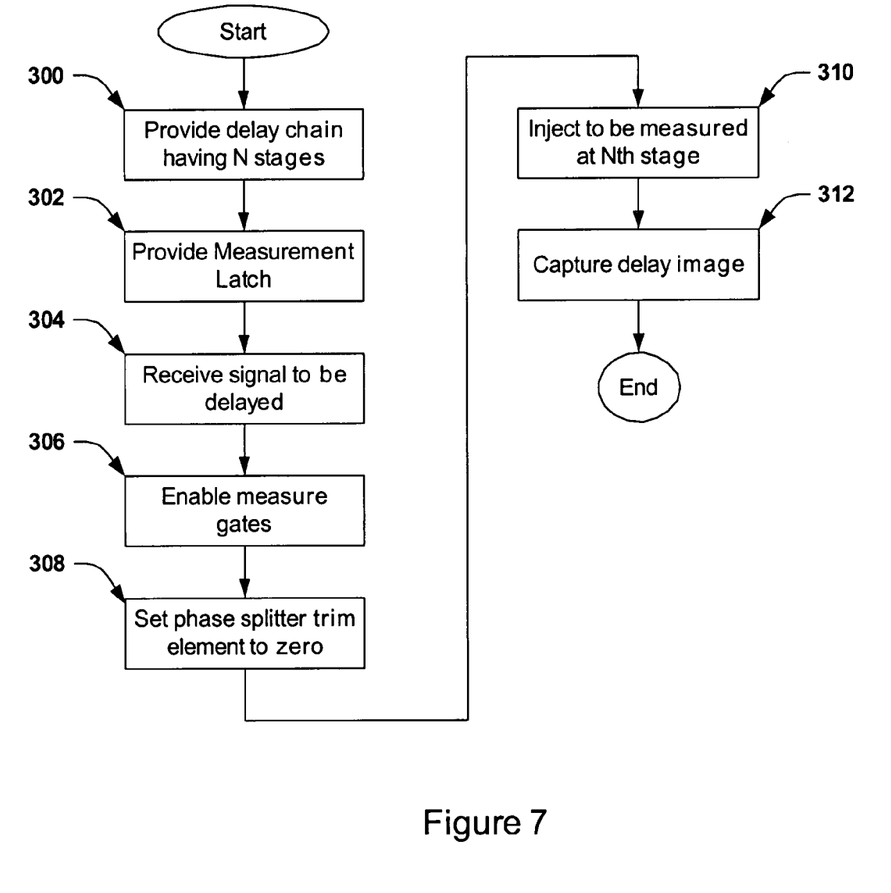
FIG. 7 is a flow chart of one embodiment of the method of measuring the delay of a signal in accordance with the present invention.

The method for measuring the delay of a signal in accordance with a preferred embodiment of the present invention is shown in FIG. 7. As indicated by a step 300 shown in FIG. 7, a delay chain is provided comprising a plurality N of series-connected delay stages, each delay stage preferably receiving an output of a previous stage.

When a delay measurement operation is performed, a measurement latch is provided and a measurement control gate is connected to the output of each delay stage to control switching at the input of the measurement latch, as indicated by a step 302 shown in FIG. 7. The measurement control gates are enabled, as indicated by a step 306 shown in FIG. 7. In the embodiment in which a sub-tap delay resolution is provided, the trim is set to zero, as indicated by a step 308 shown in FIG. 7. As indicated by a step 310 shown in FIG. 7, an electrical signal is injected into the delay stage logically located farthest from the exit of the delay chain. The delay measurement is completed as indicated by a step 310 shown in FIG. 7, such that a delay measurement operation captures an instantaneous delay image of a signal from each tap of the delay chain, as indicated by a step 312 shown in FIG. 7. Preferably, as described earlier, the output of each measurement latch bit is either inverting or non-inverting to correct for the bi-modal representation of the delay image captured during measurement.

Figure 8:
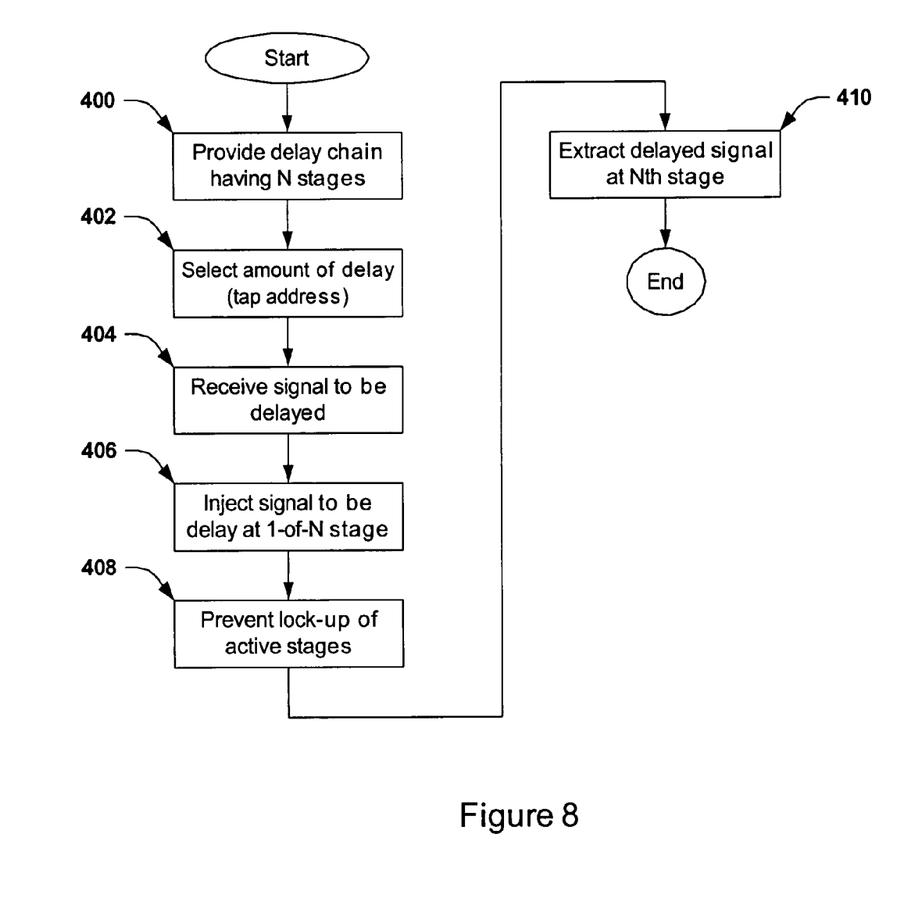
FIG. 8 is a flow chart of one embodiment of the method of delaying an electrical signal in accordance with the present invention.

The method for delaying an electrical signal propagating from an input to an output in accordance with a preferred embodiment of the present invention is shown in FIG. 8. As indicated by a step 400 shown in FIG. 8, a delay chain is provided comprising a plurality N of series-connected delay stages, each delay stage preferably receiving one of an output of a previous stage and an injected signal. A desired delay is achieved by selecting an injection point relative to the final delay stage of the delay chain, as indicated by a step 402 shown in FIG. 8. As indicated by a step 404, an electrical signal to be delayed is received. As indicated by step 406 shown in FIG. 8 a trim circuit is preferably provided. In the embodiment in which a trim circuit is provided, the electrical signal to be delayed is first passed through the trim delay circuit of the phase splitter circuit before being injected into a selected delay stage in response to receiving the electrical signal to be delayed, as indicated by a step 408. As described above in conjunction with FIG. 4, the injection of the electrical signal to be delayed may be preceded by producing inverted and non-inverted versions of the electrical signal to be delayed and distributing the inverted and non-inverted versions into the delay stages. Also, only that portion of the delay chain needed to achieve a desired amount of delay is preferably rendered active, thereby reducing the amount of switching power. As indicated by a step 410, the method for delaying the electrical signal propagating from an input to an output in accordance with a preferred embodiment of the present invention shown in FIG. 8 includes preventing the propagation of a lock-up condition from non-participating delay stages into active delay stages. The delayed electrical signal is extracted at the exit of the delay chain corresponding to the output of the Nth delay stage, as indicated by a step 412 shown in FIG. 8.

The variable multiple-input, single-exit digital delay line architecture in accordance with the various embodiments of the present invention can be used in various applications. For example, the variable multiple-input, single-exit digital delay line can be used in timing correction and/or deskewing, signal (pulse) shaping such as duty cycle correction, and signal synthesis applications.

The novel digital delay line in accordance with the various embodiments of the present invention provides a variable multiple-input, single-exit digital delay line configuration in which the delayed signal is extracted from the final stage of the delay chain and the input signal is introduced at 1-of-N injection points along the length of the delay chain. The desired delay is achieved by introducing the input signal at a selected injection point relative to the final stage of the delay chain, thereby eliminating the need for a conventional tap-select multiplexer output circuit. As a direct result of eliminating the multiplexer output circuit, a reduction in the overall size, delay latency, and switching power is achieved. Additionally, with the incorporation of a signal phase splitter circuit, the delay line architecture in accordance with one modification can easily support tap resolutions based on a gate delay with a modest increase in the number of transistors required, thereby effectively doubling the resolution. Increased variable delay resolution is also preferably provided using selectable trim circuits.

Although the present invention has been described with a particular degree of specificity with reference to various embodiments, it should be understood that numerous changes can be made without departing from the spirit of the invention. The scope of protection sought is to be limited only by the scope of the appended claims that are intended to suitably cover the invention.

We claim:

1. A delay line for delaying an electrical signal propagating from an input to an output, comprising:
   means for creating an inverted version and a non-inverted version of the electrical signal to be delayed; a delay chain comprising a plurality N of series-connected delay stages including a first delay stage, an Nth delay stage, and one or more intermediate delay stages connected between the first and Nth delay stages, each of the intermediate delay stages and the Nth delay stage receiving one of an output of a previous stage and an injected signal, wherein said injected signal comprises one of the inverted version and the non-inverted version of the electrical signal to be delayed, and wherein the delayed output signal is extracted from the Nth delay stage; and means coupled to the delay chain for providing the injected signal into a selected delay stage of the plurality N of series-connected delay stages in response to a tap address value,
   wherein each delay stage is a NAND gate delay stage for accepting one of the output of the previous stage and the injected signal, wherein the delayed output signal is extracted from the last NAND gate delay stage.

2. The delay line according to claim 1 wherein the means coupled to the delay chain for providing the injected signal to a selected delay stage comprises a plurality of tap decode gates used to inject the electrical signal to be delayed into the delay chain at an injection point.

3. The delay line according to claim 1 wherein the means coupled to the delay chain for providing the injected signal to a selected delay stage comprises a plurality of tap decode gates used to inject the electrical signal to be delayed into the delay chain using an input of the selected NAND gate delay stage coupled to an injection point.

4. The delay line according to claim 2 wherein a desired delay is achieved by selecting an injection point relative to the Nth delay stage of the delay chain.

5. The delay line according to claim 3 wherein a desired delay is achieved by selecting an injection point relative to the Nth NAND gate delay stage of the delay chain, whereby selection of an injection point is provided by a binary decode of said tap address value that activates the injection NAND gate delay stage, allowing the injected signal to propagate from the activated injection point to an exit point of the delay chain.

6. The delay line according to claim 1, further comprising means for preventing the propagation of a lock-up condition from non-participating NAND gate delay stages into active NAND gate delay stages.

7. The delay line according to claim 1, wherein the means for creating the inverted version and the non-inverted version of the electrical signal to be delayed comprises a phase splitter circuit, and wherein the means for providing the injected signal comprises appropriately connected pass-gate injectors coupled to either of two phase splitter circuit outputs to provide the injected signal.

8. The delay line according to claim 2, wherein the means for creating the inverted version and the non-inverted version of the electrical signal to be delayed comprises a phase splitter circuit, and wherein the means for providing the injected signal comprises appropriately connected pass-gate injectors coupled from either of two phase splitter circuit outputs to the injection points to provide the injected signal.

9. The delay line according to claim 3, wherein the means for creating the inverted version and the non-inverted version of the electrical signal to be delayed comprises a phase splitter circuit, and wherein the means for providing the injected signal comprises appropriately connected pass-gate injectors coupled from either of two phase splitter circuit outputs to the injection points to provide the injected signal.

10. The delay line according to claim 1, further comprising at least one selectable trim circuit coupled to an output of each of the NAND gate delay stages for providing increased delay resolution directly proportional to an incremental delay provided by the trim circuit.

11. A delay line for delaying an electrical signal propagating from an input to an output, comprising:
    means for receiving the electrical signal to be delayed;
    a delay chain comprising a plurality N of series-connected delay stages, each delay stage receiving one of a lock-up prevention signal, an output of a previous stage and an injected signal, wherein the delayed output signal is extracted from the Nth delay stage;
    means coupled to the delay chain for providing the injected signal into a selected delay stage of the plurality N of series-connected delay stages in response to a tap address value; and
    means for preventing the propagation of a lock-up condition from non-participating delay stages into active delay stages by supplying the lock-up prevention signal to at least one of the plurality of delay stages.

12. A delay line for delaying an electrical signal propagating from an input to an output, comprising:
    means for receiving the electrical signal to be delayed;
    a delay chain comprising a plurality N of series-connected delay stages including a first delay stage, an Nth delay stage, and one or more intermediate delay stages connected between the first and Nth delay stages, each of the intermediate delay stages and the Nth delay stage receiving one of an output of a previous stage and an injected signal, wherein the delayed output signal is extracted from the Nth delay stage;
    means coupled to the delay chain for providing the injected signal into a selected delay stage of the plurality N of series-connected delay stages in response to a tap address value; and
    at least one selectable trim circuit coupled to each of the delay stages for providing increased delay resolution directly proportional to an incremental delay provided by the trim circuit.

13. A delay line for delaying an electrical signal propagating from an input to an output, comprising:
    means for creating an inverted version and a non-inverted version of the electrical signal to be delayed; a delay chain comprising a plurality N of series-connected delay stages including a first delay stage, an Nth delay stage, and one or more intermediate delay stages connected between the first and Nth delay stages, each of the intermediate delay stages and the Nth delay stage receiving one of an output of a previous stage and an injected signal, wherein said injected signal comprises one of the inverted version and the non-inverted version of the electrical signal to be delayed, and wherein the delayed output signal is extracted from the Nth delay stage; and
    means coupled to the delay chain for providing the injected signal into a selected delay stage of the plurality N of series-connected delay stages in response to a tap address value,
    wherein the means for creating an inverted version and a non-inverted version of the electrical signal to be delayed comprises a positive bit line for receiving the non-inverted version of the electrical signal to be delayed, a negative bit line for receiving the inverted version of the electrical signal to be delayed, and power saving logic gates to force the bit line not being used into a quiescent state, whereby only that portion of the delay chain needed to achieve a desired amount of delay remains active, thereby reducing the amount of switching power.

14. A delay line for delaying an electrical signal propagating from an input to an output, comprising:
    means for receiving the electrical signal to be delayed;
    a delay chain comprising a plurality N of series-connected delay stages including a first delay stage, an Nth delay stage, and one or more intermediate delay stages connected between the first and Nth delay stages, each of the intermediate delay stages and the Nth delay stage receiving one of an output of a previous stage and an injected signal, wherein the delayed output signal is extracted from the Nth delay stage;
    means coupled to the delay chain for providing the injected signal into a selected delay stage of the plurality N of series-connected delay stages in response to a tap address value; and
    a measurement control gate connected to the output of each delay stage to control switching at the input of a measurement latch to capture an instantaneous delay image of a signal from each tap of the delay chain.

15. The delay line according to claim 14 wherein the output of each measurement latch bit is either inverting or non-inverting to correct for the bi-modal representation of the delay image captured during measurement.

16. A delay line for delaying an electrical signal propagating from an input to an output, comprising:
    means for creating an inverted version and a non-inverted version of the electrical signal to be delayed; a delay chain comprising a plurality N of series-connected delay stages including a first delay stage, an Nth delay stage, and one or more intermediate delay stages connected between the first and Nth delay stages, each of the intermediate delay stages and the Nth delay stage receiving one of an output of a previous stage and an injected signal, wherein said injected signal comprises one of the inverted version and the non-inverted version of the electrical signal to be delayed, and wherein the delayed output signal is extracted from the Nth delay stage; means coupled to the delay chain for providing the injected signal into a selected delay stage of the plurality N of series-connected delay stages in response to a tap address value; and
    a measurement control gate connected to the output of each NAND gate delay stage to control switching at the input of a measurement latch to capture an instantaneous delay image of a signal from each tap of the delay chain.

17. The delay line according to claim 16 wherein the output of each measurement latch bit is either inverting or non-inverting to correct for the bi-modal representation of the delay image captured during measurement.

18. A method for delaying an electrical signal, comprising the steps of:
  receiving the electrical signal to be delayed;
  creating an inverted version and a non-inverted version of the electrical signal to be delayed;
  providing a delay chain comprising a plurality N of series-connected delay stages including a first delay stage, an Nth delay stage, and one or more intermediate delay stages connected between the first and Nth delay stages, each of the intermediate delay stages and the Nth delay stage receiving one of an output of a previous stage and an injected signal, wherein said injected signal comprises one of the inverted version and the non-inverted version of the electrical signal to be delayed, and wherein the delayed output signal is extracted from the Nth delay stage;
  providing the injected signal to a selected delay stage of the plurality N of series-connected delay stages in response to a tap address value; and
  preventing the propagation of a lock-up condition from non-participating delay stages into active delay stages.

19. The method according to claim 18 wherein a desired delay is achieved by selecting an injection point relative to the final delay stage of the delay chain, thereby allowing the injected signal to propagate from the activated injection point to an exit point of the delay chain.

20. The method according to claim 18, further comprising distributing the inverted and non-inverted versions of the electrical signal to be delayed into the delay stages.

21. The method according to claim 18, further comprising the step of rendering active only that portion of the delay chain needed to achieve a desired amount of delay, thereby reducing the amount of switching power.

22. A method for delaying an electrical signal, comprising the steps of:
  receiving the electrical signal to be delayed;
  creating an inverted version and a non-inverted version of the electrical signal to be delayed;
  providing a delay chain comprising a plurality N of series-connected delay stages including a first delay stage, an Nth delay stage, and one or more intermediate delay stages connected between the first and Nth delay stages, each of the intermediate delay stages and the Nth delay stage receiving one of an output of a previous stage and an injected signal, wherein said injected signal comprises one of the inverted version and the non-inverted version of the electrical signal to be delayed, and wherein the delayed output signal is extracted from the Nth delay stage;
  providing the injected signal to a selected delay stage of the plurality N of series-connected delay stages in response to a tap address value; and
  providing at least one selectable trim circuit coupled to each of the delay stages to enable selection of increased delay resolution directly proportional to an incremental delay.

23. A method for delaying an electrical signal, comprising the steps of:
  receiving the electrical signal to be delayed;
  creating an inverted version and a non-inverted version of the electrical signal to be delayed;
  providing a delay chain comprising a plurality N of series-connected delay stages including a first delay stage, an Nth delay stage, and one or more intermediate delay stages connected between the first and Nth delay stages, each of the intermediate delay stages and the Nth delay stage receiving one of an output of a previous stage and an injected signal, wherein said injected signal comprises one of the inverted version and the non-inverted version of the electrical signal to be delayed, and wherein the delayed output signal is extracted from the Nth delay stage;
  providing the injected signal to a selected delay stage of the plurality N of series-connected delay stages in response to a tap address value; and
  providing a measurement control gate connected to the output of each delay stage to control switching at the input of a measurement latch to capture an instantaneous delay image of a signal from each tap of the delay chain.

24. The method according to claim 23 wherein the output of each measurement latch bit is either inverting or non-inverting to correct for the bi-modal representation of the delay image captured during measurement.

* * * * *